United States Patent [19]
Ogawa

[11] Patent Number: 4,517,520
[45] Date of Patent: May 14, 1985

[54] CIRCUIT FOR CONVERTING A STAIRCASE WAVEFORM INTO A SMOOTHED ANALOG SIGNAL

[75] Inventor: Atsushi Ogawa, Tokyo, Japan
[73] Assignee: Trio Kabushiki Kaisha, Japan
[21] Appl. No.: 407,601
[22] Filed: Aug. 12, 1982

[30] Foreign Application Priority Data
Aug. 24, 1981 [JP] Japan .................................. 56-132422
Aug. 24, 1981 [JP] Japan .................................. 56-132423

[51] Int. Cl.$^3$ ............................................. H03K 5/00
[52] U.S. Cl. ...................................... 329/145; 329/50; 329/126; 328/27; 307/261
[58] Field of Search ................... 329/50, 109, 126, 145; 381/4, 7; 328/27, 35; 307/261

[56] References Cited
U.S. PATENT DOCUMENTS
3,491,282  1/1970  Heinrick et al. ................ 307/261 X
4,160,922  7/1979  Rickenbacker ..................... 307/261

FOREIGN PATENT DOCUMENTS
1270605  6/1968  Fed. Rep. of Germany ...... 307/261

Primary Examiner—Eugene R. Laroche
Assistant Examiner—Robert J. Pascal
Attorney, Agent, or Firm—Murray, Whisenhunt & Ferguson

[57] ABSTRACT

In converting a staircase waveform signal into a smoothed analog signal, this circuit can perform the high-quality conversion without any sophisticated low-pass filter. An input staircase signal is delayed for one stepping interval to produce a differential signal which represents a stepping height at each step, by taking the difference between the input staircase signal and the one stepping interval delayed version thereof. The differential signal is integrated at every stepping interval. The integrated voltage forms a sawtooth wave signal which is in turn additively combined with the one stepping interval delayed version of the input staircase signal. The resulted combined signal is a smoothed signal of the input staircase signal.

4 Claims, 10 Drawing Figures

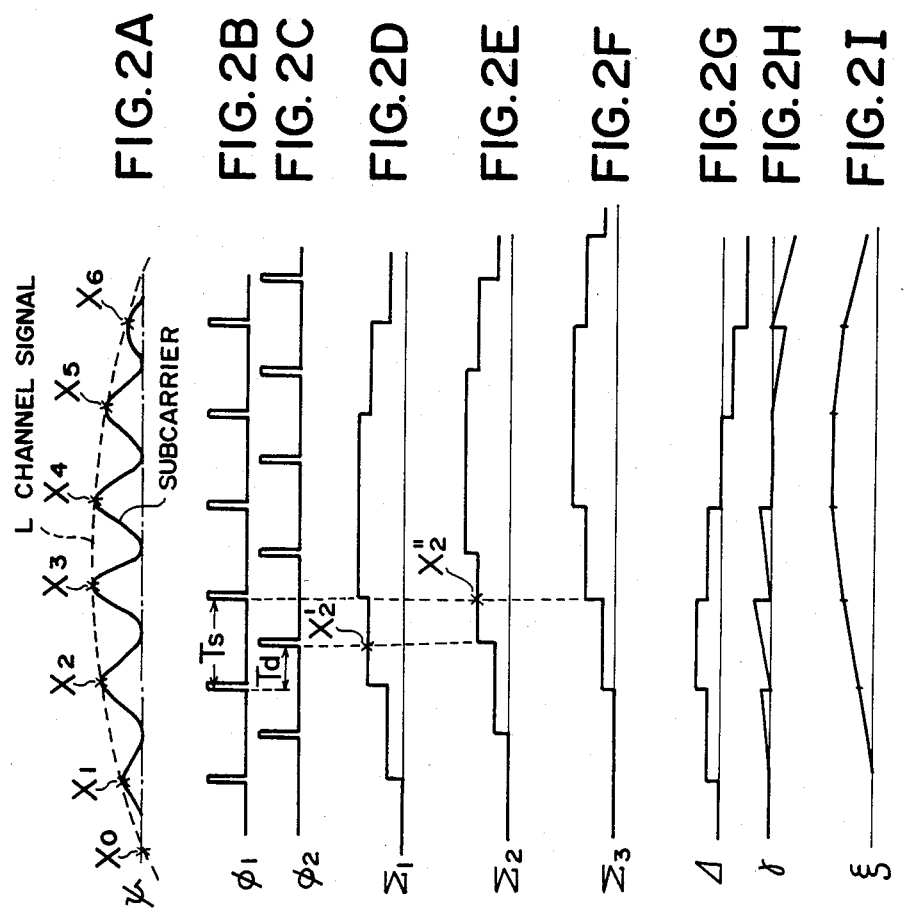

CIRCUIT FOR CONVERTING A STAIRCASE WAVEFORM INTO A SMOOTHED ANALOG SIGNAL

BACKGROUND OF THE INVENTION

The present invention relates to a circuit for converting a staircase waveform into a smoothed analog signal, and more particularly to a circuit in the form of an improved sample-hold type FM stereo demodulator.

For the stereo demodulator or MPX of FM receivers, there are two types, one being matrix type and the other switching type. The sample-hold stereo demodulator is an improved one of the switching type and has advantages of high channel separation ratio between left and right channel signals and superior dynamic subcarrier suppression. A broadcasting stereo composite signal consists of the addition (L+R) of left and right channel signals, a subcarrier amplitude-modulated by the difference (L−R) of left and right channel signals in carrier suppressed double sideband formula and a pilot signal. In the sample-hold stereo demodulator, two sampling pulse sequences with the same repetition rate as the subcarrier frequency are used. One sampling pulse sequence is in phase with the subcarrier and takes samples of the composite signal for a left channel signal and then holds the taken samples for the sampling interval. The other sampling sequence is in reverse phase with the subcarrier and takes samples for a right channel signal in a similar manner. The output signals of the sample-hold circuit are staircase waveforms of the left and right channel signals. Although the staircase waveform contains less undesired components as compared with a series of samples obtained by an ordinary switching means, for high-fidelity reproduction a sophisticated lowpass filter is still required to completely eliminate the residual subcarrier component and other spurious frequency components from the staircase channel signal without introducing any distortion for amplitude and phase characteristics of the channel signal. It is considered that, if the staircase waveform is further approximated to the original analog waveform shape of a channel signal, such severe requirements for the filter will be relieved. The Japanese Utility Model Application No. 54-157501 filed Nov. 13, 1979 by the same assignee disclosed a simulated analog signal converting circuit for digital signal like a staircase waveform in which each stepping height of the staircase is linked with a flight of more finely stepped stairs.

The object of the present invention is to provide a more improved circuit for converting staircase waveforms into smoothed analog waveforms.

SUMMARY OF THE INVENTION

In accordance with this invention, the circuit comprises a delay unit for delaying an input staircase signal with a regular stepping time interval but different stepping heights for one stepping interval, means for producing a differential signal which represents stepping height at each step by taking the difference between the input staircase signal and the one stepping interval delayed version thereof, means for integrating the differential signal with respect to time at every stepping interval to produce a sawtooth wave signal with substantially linear slopes, and means for additively combining the sawtooth wave signal with the one stepping interval delayed version. The resulting combined signal is in a waveform made by linking the edge points of the staircase with linear segments, which substantially contains no stepping interval frequency component and harmonics thereof because of smoothed analog waveform.

According to one aspect of the invention, the circuit is constructed as an FM stereo demodulator. The circuit includes means for receiving a left and right channel signal amplitude-modulated subcarrier and producing a staircase waveform of the analog channel signal. The produced staircase waveform channel signal is smoothed through the above mentioned circuit for smoothing a staircase waveform signal.

According to another aspect of the invention, the delay unit comprises a plurality of sample-hold circuits in cascade connection, the first stage one receiving an input staircase waveform signal, and the last stage one producing a desired time delayed output staircase waveform signal without any sag of the flat portions and collapse of leading and trailing edges, that is, without any waveshape distortion of the input staircase waveform signal.

BRIEF DESCRIPTION OF THE DRAWINGS

FIG. 2A–FIG. 2I are waveform diagrams relating to the circuit of FIG. 1.

DESCRIPTION OF THE PREFERRED EMBODIMENT

Figure 1:
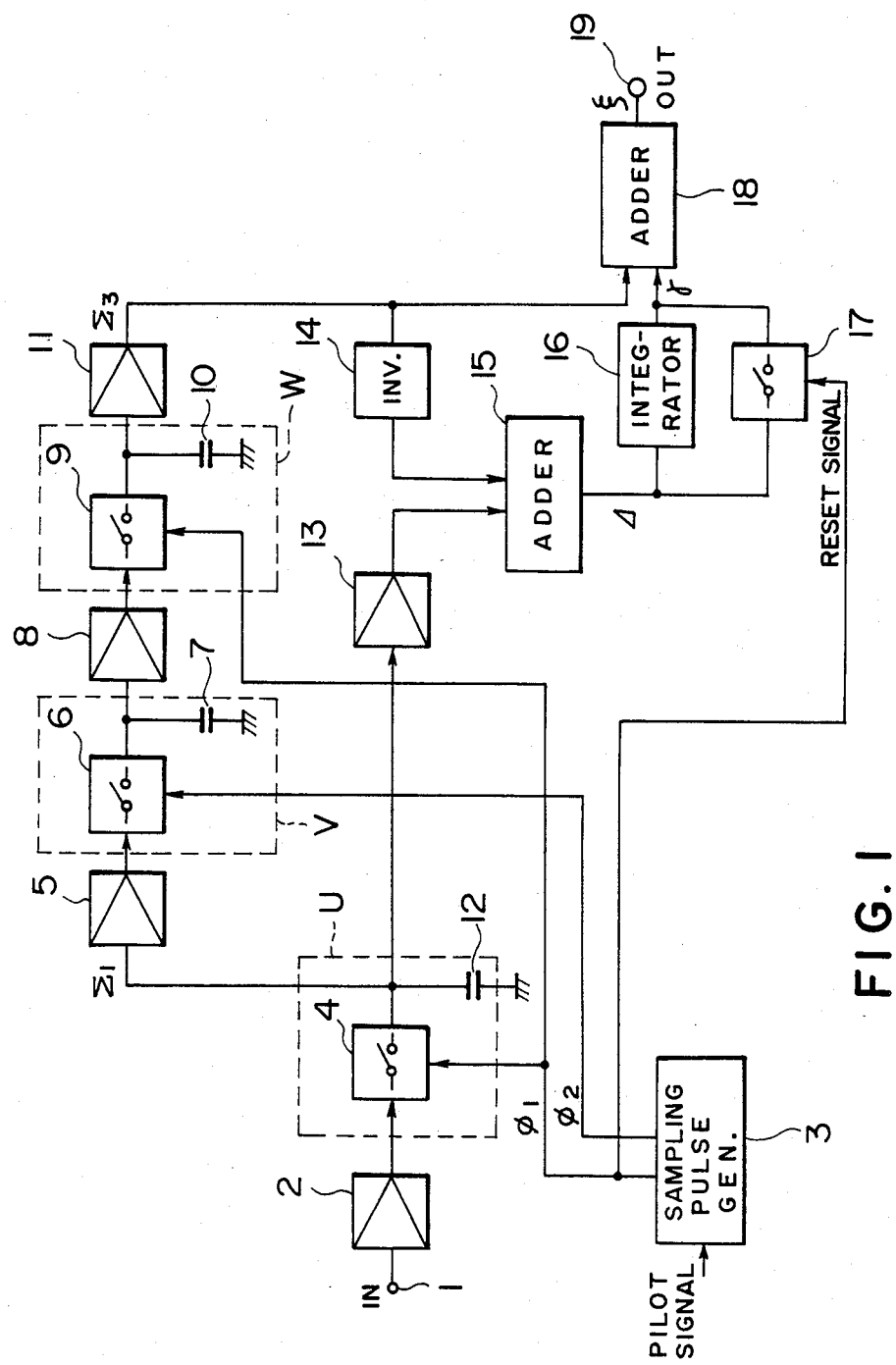
FIG. 1 is a schematic block diagram of an exemplary embodiment according to the present invention in the form of an FM stereo demodulator.

Describing now the drawings, FIG. 1 shows an FM stereo demodulator, for the purpose of simple illustration, only a left channel unit. The structure and its working will be explained with reference to FIGS. 2A–2I which show waveforms appearing at the circuit of FIG. 1. Channel signal AM subcarrier signal $\psi$ of 38 KHz out of a stereo composite signal, shown in FIG. 2A, is applied from terminal 1 through buffer amplifier 2 to sample-hold circuit U contructed by switch 4 and capacitor 12. As a simple illustration, signal $\psi$ of FIG. 2A is in a subcarrier which is amplitude-modulated only by a left channel signal. The envelope of signal $\psi$ represented by a dotted line means the left channel signal. As the buffer amplifier, a high slew rate, high input impedance and low output impedance operational amplifier is preferably selected. All other buffer amplifiers 5, 8, 11 and 13 in the circuit are the same type. As the switch, a CMOS analog switch is preferably selected to maintain low distortion in a sample-hold function. Other switches 6 and 9 are the same type. Sampling pulse generator 3 receives a pilot signal of 19 KHz and derives from the pilot signal two kinds of 38 KHz sampling pulse sequences $\phi_1$ and $\phi_2$ shown in FIGS. 2B and 2C. Sampling pulse sequence $\phi_1$ is in phase with the subcarrier and has repetition interval $T_s$, while sampling pulse sequence $\phi_2$ is shifted by time $T_d$ less than $T_s$ with respect to sampling pulse sequence $\phi_1$. The duty ratio in the two sampling pulse sequences $\phi_1$ and $\phi_2$ is about 5%. Sampling pulse sequence $\phi_1$ is applied to switch 4 and closes it during high level state. Consequently, samples $X_0, X_1, X_2, \ldots, X_5, X_6$ of signal $\psi$ are taken. At each sampling, capacitor 12 is rapidly charged up to the corresponding sample voltage through the low output impedance and high slew rate of buffer amplifier 2. The charged voltage in capacitor 12 is held without any decay until switch 4 is closed at the next sampling timing, that is for sampling interval $T_s$ because of the high impedance of opened switch 4 and the high input impedance of succeeding buffer amplifiers 5 and 13. In the above manner, sample-hold circuit U produces staircase waveform signal $\Sigma_1$ for the left channel signal, as shown in FIG. 2D.

Staircase signal $\Sigma_1$ is passed through two sample-hold circuits V and W in cascade connection and delayed for one stepping interval of staircase signal $\Sigma_1$, which also means one sampling interval $T_s$. Although this delay can be conducted through a delay line of lump or distributed parameter analog circuit elements, resistor, capacitor and inductor, the illustrated delay unit of sample-hold circuits in cascade connection is preferable for maintaining the waveform shape of staircase. This is because any actual analog type delay line has a particular amplitude and phase characteristics vs. frequency which can delay an input signal but simultaneously distorts the waveform shape of the input signal. As mentioned later, this distortion is very undesirable for reproducing a channel signal with high fidelity quality. At sample-hold circuit V constructed by switch 6 and capacitor 7, staircase signal $\Sigma_1$ is sampled at the timing of sampling pulse sequence $\phi_2$ which is applied to control switch 6 and the taken samples are held for the sampling interval $T_s$. For instance, sample $X'_2$ of staircase signal $\Sigma_1$ is taken. The resulting output of sample-hold circuit V is a staircase signal $\Sigma_2$ shown in FIG. 2E, which is delayed for time period $T_d$. Delayed staircase signal $\Sigma_2$ proceeds to next stage sample-hold circuit W, which is constructed by switch 9 and capacitor 10, through buffer amplifier 8. Behind sample-hold circuit W, high input impedance buffer amplifier 11 follows. Staircase signal $\Sigma_2$ is sampled at the timing of sampling pulse sequence $\phi_1$ which is applied to control switch 9 and the taken samples are held for sampling interval $T_s$. For instance, sample $X''_2$ is taken. As the output of sample-hold circuit W, one stepping (sampling) interval delayed staircase waveform version $\Sigma_3$ of signal $\Sigma_1$ is obtained as shown in FIG. 2F.

To perform the required function of this circuit in the best mode, it is desired that staircase signals $\Sigma_1$, $\Sigma_2$ and $\Sigma_3$ have clearly defined steps without sag of the flat portions and collapse of leading and trailing edges. The desired clearly defined step staircase waveform will be obtained by buffer amplifiers 2, 5, 11 and 13 with the characteristics of high input impedance, low output impedance and high slew rate and switches 4, 6 and 9 with the characteristics of low on-mode impedance, high off-mode impedance and high isolation to the control gate.

Staircase signal $\Sigma_1$ from sample-hold circuit U is applied through buffer amplifier 13 to adder 15 and one stepping interval delayed staircase signal $\Sigma_3$ from buffer amplifier 11 also is applied to adder 15, but in an inverted form through invertor 14. The output of adder 15, which is the difference between staircase signals $\Sigma_1$ and $\Sigma_3$, is shown as differential signal $\Delta$ in FIG. 2G. The amplitude of signal $\Delta$ means the difference between the present one sample value and the immediately preceding sample value, that is stepping height at the present step. In the drawings of FIG. 2A and FIG. 2G, amplitude $\Delta_{1-0}$ equals to the difference of sample value $X_1$ and $X_0$, and amplitudes $\Delta_{2-1}$, $\Delta_{3-2}$, ... and $\Delta_{6-5}$ to the differences of $X_2$ and $X_1$, $X_3$ and $X_2$, ... and $X_6$ and $X_5$, respectively. Differential signal $\Delta$ is applied to integrator 16 in which the integrated voltage is reset at every stepping interval by switch 17 controlled with sampling pulse sequence $\phi_1$. The circuit parameters should be selected so that the integrated voltage may equal to $1/T_s \int$ (input voltage)dt. In such condition, during every stepping interval the integrated voltage starts to increase in a substantially linear slope from zero just after resetting and reaches the final value just before the next resetting, the final value being equal to the amplitude at its interval which means the difference between the present sample value and the immediately preceding sample value of signal $\psi$. The output of integrator 16 is a sawtooth waveform signal $\gamma$ shown in FIG. 2H. As the last processing, signal $\gamma$ is additively combined with one interval delayed staircase signal $\Sigma_3$ at adder 18 and the combined signal $\epsilon$ shown in FIG. 2I is output at terminal 19. It will be understood that the combined signal $\epsilon$ corresponds to an one stepping or sampling interval delayed version of the waveform made by linking samples $X_0$, $X_1$, $X_2$, ... and $X_6$ of signal $\psi$ of FIG. 2A with linear sloped segments. Accordingly, the combined signal $\epsilon$ is a very close approximation of the envelope of signal $\psi$, that is the left channel analog signal. In order to correctly approximate the linking sloped segments with sawtooth signal $\gamma$ of FIG. 2H, it is required to keep the correct constant amplitude of differential signal $\Delta$ throughout the whole one interval. As previously mentioned, thus it is important to produce clearly defined step staircase waveform as signal $\Sigma_1$ and delay signal $\Sigma_2$ for one stepping interval without distortion of the waveform shape to obtain signal $\Sigma_3$.

Since output signal $\epsilon$ virtually consists of the left channel signal component and contains only negligible small residual subcarrier component and spurious components, a lowpass filter can be eliminated or only simple lowpass filter will be required in the sample-hold type FM stereo demodulator. This allows low distortion and low noise stereo signals to be demodulated or reproduced. And also, virtually analog signal $\epsilon$ does not require a high slew rate output amplifier which is provided in conventional type FM sample-hold stereo demodulator to amplify a staircase waveform and deliver it to the next stage.

While there is shown and described present preferred embodiment of the invention in FM stereo demodulator, it is to be distinctly understood that the invention is not limited thereto but may be otherwise variously embodied and practiced within the scope of the following claims.

I claim:

1. A circuit for converting an input staircase waveform signal (e.g., $\Sigma_1$) with a regular stepping time interval but different stepping heights into a smoothed analog signal (e.g., $\epsilon$) comprising:
    a delay unit for delaying said input staircase signal for one said stepping interval,
    means for producing a differential signal (e.g., $\Delta$) by taking the difference between said input staircase signal and said one stepping interval delayed version (e.g., $\Sigma_3$) thereof,
    means for integrating said differential signal with respect to time at every stepping interval to produce a sawtoothwave signal (e.g., $\gamma$) with substantially linear slopes, and
    means for additively combining said sawtoothwave signal with said one stepping interval delayed version.

2. A circuit according to claim 1 wherein said delay unit comprises first and second sample-hold circuits (e.g., V, W) in cascade connection and sampling pulse generator (e.g., 3), said generator issues a first sampling pulse sequence (e.g., $\phi_1$) in synchronism with said stepping interval timing and a second sampling pulse sequence (e.g. $\phi_2$) being a predetermined time delayed version of said first sampling pulse sequence, said first sample-hold circuit receives said input staircase signal (e.g., $\Sigma_1$) and sample-holds it with said second sampling pulse sequence to produce a version (e.g., $\Sigma_2$) of the input staircase signal which is delayed for said predetermined time, and said second sample-hold circuit receives said predetermined time delayed version (e.g., $\Sigma_2$) and sample-holds it with said first sampling pulse sequence to produce said one stepping interval delayed version (e.g., $\Sigma_3$) of the input staircase signal.

3. An FM stereo demodulator for a left and right channel signal amplitude-modulated subcarrier including left and right channel units, each channel unit comprising:

means for producing a staircase waveform (e.g., $\Sigma_1$) of the channel signal by sample-holding said amplitude-modulated subcarrier (e.g., $\phi$) at sampling intervals in phase with or in reverse phase with the subcarrier period, a delay unit for receiving said staircase signal and delaying it for one said sampling interval (e.g, $T_s$), means for producing a differential signal (e.g., $\Delta$) by taking the difference between said staircase signal (e.g., $\Sigma_1$) and said one sampling interval delayed version (e.g., $\Sigma_3$) thereof, means for integrating said differential signal with respect to time at every sampling interval to produce a sawtoothwave signal (e.g., $\gamma$) with substantially linear slopes, and means for additively combining said sawtoothwave signal with said one sampling interval delayed version to demodulate the channel signal.

4. An FM stereo demodulator according to claim 3 wherein said delayed unit comprises first and second sample-hold circuits (e.g., V, W) in cascade connection and sampling pulse generator (e.g., 3), said generator issues a first sampling pulse sequence (e.g., $\phi_1$) in synchronism with said sampling interval timing and a second sampling pulse sequence (e.g., $\phi_2$) being a predetermined time (e.g., $T_d$) delayed version of said first sampling pulse sequence, said first sample-hold circuit receives said input staircase signal (e.g., $\Sigma_1$) and sample-holds it with said second sampling pulse sequence to produce a version (e.g., $\Sigma_2$) of the input staircase signal which is delayed for said predetermined time, and said second sample-hold circuit receives said predetermined time delayed version (e.g., $\Sigma_2$) and sample-holds it with said first sampling pulse sequence to produce said one sampling interval delayed version (e.g., $\Sigma_3$) of the input staircase signal.

* * * * *